(12) United States Patent
Wang et al.

(10) Patent No.: US 12,349,388 B2
(45) Date of Patent: Jul. 1, 2025

(54) PREPARATION METHOD OF HIGH-LINEARITY GAN-BASED MILLIMETER WAVE DEVICE

(71) Applicants: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangzhou (CN)

(72) Inventors: Hong Wang, Guangzhou (CN); Xiaoyi Liu, Guangzhou (CN); Jingxiong Chen, Guangzhou (CN)

(73) Assignees: ZHONGSHAN INSTITUTE OF MODERN INDUSTRIAL TECHNOLOGY, SOUTH CHINA UNIVERSITY OF TECHNOLOGY, Guangdong (CN); SOUTH CHINA UNIVERSITY OF TECHNOLOGY, Guangzhou (CN)

( * ) Notice: Subject to any disclaimer, the term of this patent is extended or adjusted under 35 U.S.C. 154(b) by 519 days.

(21) Appl. No.: 17/695,874

(22) Filed: Mar. 16, 2022

(65) Prior Publication Data
US 2022/0209002 A1    Jun. 30, 2022

Related U.S. Application Data

(63) Continuation of application No. PCT/CN2020/132734, filed on Nov. 30, 2020.

(30) Foreign Application Priority Data

Jul. 14, 2020  (CN) .......................... 202010676833.5
Oct. 13, 2020  (CN) .......................... 202011091531.8

(51) Int. Cl.
*H10D 30/47*    (2025.01)
*H01L 21/308*   (2006.01)
(Continued)

(52) U.S. Cl.
CPC ......... *H10D 30/475* (2025.01); *H01L 21/308* (2013.01); *H10D 30/015* (2025.01);
(Continued)

(58) Field of Classification Search
CPC ............. H01L 21/30621; H01L 21/308; H01L 29/2003; H01L 29/205; H01L 29/401;
(Continued)

(56) References Cited

U.S. PATENT DOCUMENTS

2008/0296618 A1* 12/2008 Suh ...................... H01L 29/432
                                                              257/190
2014/0091316 A1*  4/2014 Kikkawa ........... H01L 29/66431
                                                              438/172
(Continued)

*Primary Examiner* — Herve-Louis Y Assouman
*Assistant Examiner* — Christopher M Roland
(74) *Attorney, Agent, or Firm* — JCIPRNET

(57) ABSTRACT

The present invention discloses a high-linearity GaN-based millimeter wave device and preparation method thereof. The device includes an AlGaN/GaN heterojunction epitaxial layer, the AlGaN/GaN heterojunction epitaxial layer is of a boss structure, a protruding portion above the boss is an active region, two ends of an upper surface of the active region are respectively connected to a source electrode and a drain electrode, p-type GaN regions with different doping concentrations are located between the source electrode and the drain electrode on the upper surface of the active region, wherein the p-type GaN regions with different doping concentrations are formed by arranging a first p-type GaN region and a second p-type GaN region with different doping concentrations and the same thickness front and back along a gate width, a rear surface of the first p-type GaN region coincides with a front surface of the second p-type GaN (Continued)

region, and left and right edges of the first p-type GaN region and the second p-type GaN region are aligned respectively; and a gate electrode is located above the p-type GaN regions with different doping concentrations. The proposed structure of placing p-type GaN regions with different doping concentrations under the gate effectively modulates the threshold voltage of the device and improves the linearity of the device.

4 Claims, 6 Drawing Sheets

(51) Int. Cl.
| | | |
|---|---|---|
| *H10D 30/01* | (2025.01) | |
| *H10D 62/17* | (2025.01) | |
| *H10D 62/824* | (2025.01) | |
| *H10D 62/85* | (2025.01) | |
| *H10D 64/01* | (2025.01) | |
| *H10D 64/27* | (2025.01) | |
| *H01L 21/306* | (2006.01) | |

(52) U.S. Cl.
CPC ......... *H10D 62/343* (2025.01); *H10D 62/824* (2025.01); *H10D 62/8503* (2025.01); *H10D 64/411* (2025.01); *H01L 21/30621* (2013.01); *H10D 64/01* (2025.01)

(58) Field of Classification Search
CPC ......... H01L 29/42316; H01L 29/66462; H01L 29/7786; H10D 30/015; H10D 30/475; H10D 62/343; H10D 62/824; H10D 62/8503; H10D 64/01; H10D 64/411
See application file for complete search history.

(56) References Cited

U.S. PATENT DOCUMENTS

2019/0229209 A1* 7/2019 Lee ................... H01L 29/1066
2024/0079470 A1* 3/2024 Wei ................... H01L 29/401

* cited by examiner

Transfer curve

Transconductance curve

PREPARATION METHOD OF HIGH-LINEARITY GAN-BASED MILLIMETER WAVE DEVICE

CROSS-REFERENCE TO RELATED APPLICATION

This application is a continuation of international PCT application serial no. PCT/CN2020/132734, filed on Nov. 30, 2020, which claims the priority benefit of China application no. 202010676833.5, filed on Jul. 14, 2020 and the priority benefit of China application no. 202011091531.8, filed on Oct. 13, 2020. The entirety of each of the above-mentioned patent applications is hereby incorporated by reference herein and made a part of this specification.

TECHNICAL FIELD

The present invention relates to the technical field of semiconductors, in particular to a high-linearity GaN-based millimeter wave device and a preparation method thereof.

BACKGROUND

GaN-based HEMT devices are widely used in satellite, communication, radar and other fields. GaN is Group III nitride, which has excellent breakdown ability, higher electron density and velocity, high temperature resistance and radiation resistance, and is suitable for developing high frequency, high temperature and high power electronic devices. Moreover, due to spontaneous polarization effect and piezoelectric polarization effect at room temperature, there is a high concentration of two-dimensional electron gas at the interface of AlGaN/GaN heterojunction. Therefore, devices with the AlGaN/GaN heterojunction have high electron concentration and high electron mobility, and have broad application prospects in the construction of 5G network infrastructure, anti-missile radar and other fields.

With an increase of signal dynamic range, the linearity of power amplifier in the circuit is required to be higher and higher. However, the transconductance of traditional devices presents typical peak characteristics, that is, the transconductance is seriously degraded under high current, which leads to rapid gain compression, poor intermodulation characteristics and low linearity under high input power. In the application of large signal dynamic input of high power microwave devices, such as a power amplifier, the large signal input into power devices will go beyond the linear working region, enter the saturation region and distort, so that wrong information will be transmitted.

Researchers have tried many methods to obtain wider linear transconductance curves of transistors. For example, a Fin-HEMT structure and a composite channel heterostructure can suppress the source resistance increasing with an increase of leakage current, but the Fin-HEMT structure will reduce the saturation current of devices (Zhang M, et al, IEEE Transactions on Electronic Devices, 2018, 65 (5)), while epitaxial structures such as the composite channel heterostructure have limited linearity improvement and will lead to an increase in channel thermal resistance. Alternatively, a TRG structure with a plurality of parallel elements with continuous threshold voltage is used to broaden the transconductance curve (Wu S, et al, IEEE Electron Device Letters, 2019, 40 (6)), but it requires very precise lithography and etching process control. Based on the above, how to reduce the influence on saturation current, reduce the requirement of dry etching accuracy and achieve higher linearity is an urgent problem to be solved for GaN-based RF devices.

SUMMARY

An objection of the present invention is to overcome the defects and limitations of the existing prepared high-linearity GaN-based millimeter wave device, to propose a method of preparing a high-linearity GaN-based millimeter wave device from the perspective of parallel connection of devices with different threshold voltages, in which p-type GaN regions with different doping concentrations are used to achieve different threshold voltages, which can reduce the requirement of dry etching accuracy and improve the linearity of devices.

The object of the present invention is realized by at least one of the following technical solutions.

A high-linearity GaN-based millimeter wave device is provided, which includes an AlGaN/GaN heterojunction epitaxial layer, the AlGaN/GaN heterojunction epitaxial layer is of a boss structure, a protruding portion above the boss is an active region, two ends of an upper surface of the active region are respectively connected to a source electrode and a drain electrode, p-type GaN regions with different doping concentrations are located between the source electrode and the drain electrode on the upper surface of the active region, wherein the p-type GaN regions with different doping concentrations are formed by arranging a first p-type GaN region and a second p-type GaN region with different doping concentrations and the same thickness front and back along a gate width, a rear surface of the first p-type GaN region coincides with a front surface of the second p-type GaN region, and left and right edges of the first p-type GaN region and the second p-type GaN region are aligned; and a gate electrode is located above the p-type GaN regions with different doping concentrations.

Further, the AlGaN/GaN heterojunction epitaxial layer has a diameter of 2-10 inches and a total thickness of 200 µm–1 mm.

Further, the first p-type GaN region and the second p-type GaN region have lengths between 10 nm and 100 nm, widths greater than 5 µm, thicknesses between 5 nm and 100 nm, and doping concentrations greater than $1 \times 10^3/cm^{-3}$.

Further, the source electrode and the drain electrode are Ti/Al/Ni/Au metal layers, the source electrode and the drain electrode are cuboids with a length greater than 10 nm, a width the same as an overall p-type GaN region, and a height greater than 10 nm, and a spacing between the source electrode and the drain electrode is greater than the lengths of the first p-type GaN region and the second p-type GaN region; a left side of the source electrode coincides with a left edge of the active region, a right side of the drain electrode coincides with a right edge of the active region, and front and rear edges of the source electrode and the drain electrode coincide with front and rear edges of the active region.

Further, the rear edge of the active region coincides with the rear edge of the second p-type GaN region, a length from the front edge of the active region to the front edge of the second p-type GaN region is greater than 5 µm, a length from the left edge of the active region to the left edge of the second p-type GaN region is greater than 100 nm, and a length from the right edge of the active region to the right edge of the second p-type GaN region is greater than 100 nm.

Further, the gate electrode has a length equal to the length of the second p-type GaN region, a width equal to a sum of the widths of the first p-type GaN region and the second p-type GaN region, and a height between 50 nm and 1000 nm.

A method of preparing a high-linearity GaN-based millimeter wave device includes the following steps:

S1, growth of p-type GaN region: growing an AlGaN/GaN heterojunction epitaxial layer on a substrate and directly growing a first p-type GaN region on the AlGaN/GaN heterojunction epitaxial layer, wherein a thickness of the first p-type GaN region is between 5 nm and 100 nm;

S2, secondary growth of the p-type GaN region with different doping concentrations: covering a region except a second p-type GaN region of the secondary growth with photoresist, wherein a region not being covered by the photoresist has a length between 10 nm and 100 nm and a width greater than 5 μm, and the region is etched to within 3 nm above and below AlGaN by a dry etching process; performing a secondary epitaxial growth, wherein a thickness of a grown second p-type GaN region is equal to a length of the first p-type GaN region in step S1, and a doping concentration of the second p-type GaN region is greater than a doping concentration of the first p-type GaN region in step S1; and finally smoothing a device surface using a chemical mechanical polishing technique;

S3, mutual isolation of devices: defining a position of an active region by the photoresist on an upper surface of the AlGaN/GaN heterojunction epitaxial layer and covering the active region; and etching an upper surface of the AlGaN/GaN heterojunction epitaxial layer in a non-active region by plasma bombardment with an etching depth of 200 nm-600 nm;

S4, stripping out the source electrode and the drain electrode, and annealing to form ohmic contact: defining positions and patterns of the source electrode and the drain electrode using the photoresist so that the positions of the source electrode and the drain electrode are at two ends of an upper surface of the active region; front and rear edges of the source electrode and the drain electrode coinciding with front and rear edges of the active region; regions of non-source electrode and non-drain electrode being covered with the photoresist, first etching the regions to a surface of the AlGaN or over-etching AlGaN within 3 nm using a dry etching method, then forming the source electrode and the drain electrode by using electron beam evaporation or magnetron sputtering method and a stripping process, and finally annealing in nitrogen atmosphere at a temperature above 800° C., so that the source electrode and the drain electrode form ohmic contact with the AlGaN/GaN heterojunction epitaxial layer; and S5, preparing a gate electrode: defining a position and a pattern of the gate electrode using the photoresist, the gate electrode having a length equal to the length of the second p-type GaN region in step S2 and disposed directly above the first p-type GaN region and the second p-type GaN region; forming the gate electrode by using the electron beam evaporation or magnetron sputtering method and the stripping process; protecting the gate electrode, the source electrode and the drain electrode using the photoresist, and etching places being not covered by the photoresist to the AlGaN layer or over-etching AlGaN layer within 3 nm by using the dry etching process; removing the photoresist after the etching to complete the preparation of the high-linearity GaN-based millimeter wave device.

Further, in step S1, a substrate material is one of silicon, silicon carbide, sapphire or diamond; in step S1, an impurity doped in the growth of the first p-type GaN region is one of Mg, Zn or Fe; and the first p-type GaN region has a doping concentration of above $1\times10^3/cm^{-3}$ and a growth thickness between 5 nm and 100 nm.

Further, growth modes of the first p-type GaN region and the second p-type GaN region are both metal-organic chemical vapor deposition or molecular beam epitaxy; the dry etching is any one of inductively coupled plasma etching, reactive ion etching or other ion etching processes.

Further, in step S2, a gas for etching GaN in the dry etching is one or a mixture of Cl-containing gases such as $Cl_2$, $BCl_3$ and $SiCl_4$, or other gases capable of etching GaN materials.

Compared with the prior art, the present invention has the following advantages and beneficial effects:

in the preparation method of the high-linearity GaN-based millimeter wave device provided by the present invention, the etching of the p-type GaN region s with different doping concentrations before growth is not limited to etching to the surface of the AlGaN and has certain tolerance, thus reducing the requirement on etching accuracy. At the same time, since the doping concentration and thickness of p-type GaN regions can be adjusted, the devices with different threshold voltages have high linearity.

DETAILED DESCRIPTION OF EMBODIMENTS

The detailed description of the present invention is further described below with reference to the specific embodiments and the accompanying drawings, but the embodiments of the present invention are not limited thereto.

Embodiment 1

Figure 7:
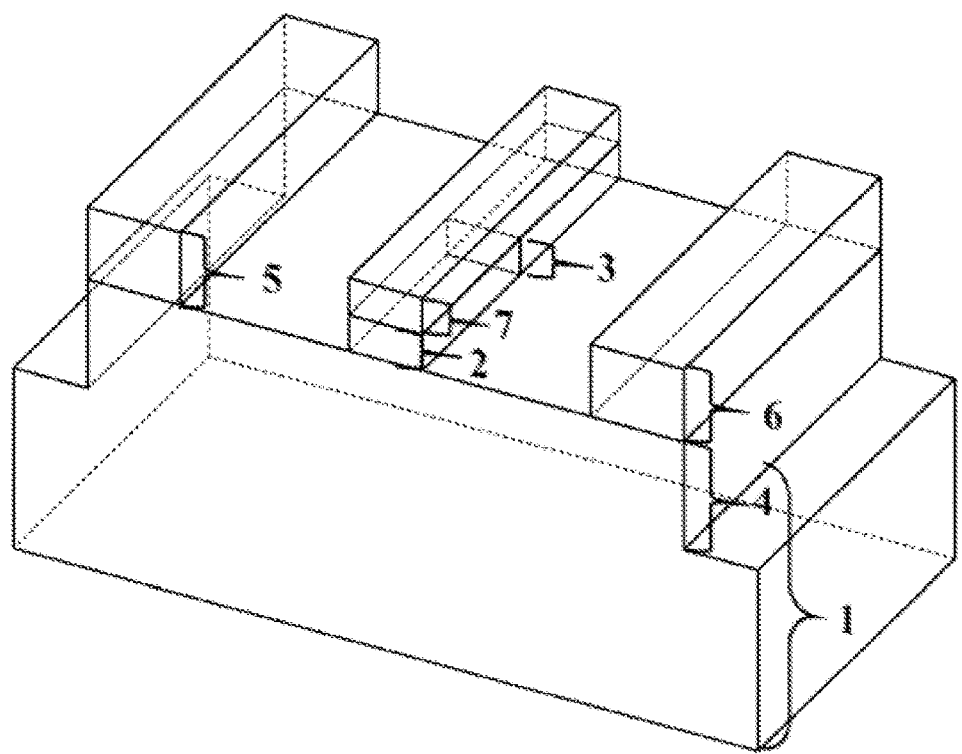
FIG. 7 is a three-dimensional perspective view of a complete high-linearity GaN-based millimeter wave device prepared in an embodiment of the present invention.

A high-linearity GaN-based millimeter wave device is provided, as shown in FIG. 7, it includes an AlGaN/GaN heterojunction epitaxial layer 1, the AlGaN/GaN heterojunction epitaxial layer 1 is of a boss structure, a protruding portion above the boss is an active region 4, two ends of an upper surface of the active region 4 are respectively connected to a source electrode 5 and a drain electrode 6, p-type GaN regions with different doping concentrations are located between the source electrode 5 and the drain electrode 6 on the upper surface of the active region 4, wherein the p-type GaN regions with different doping concentrations are formed by arranging a first p-type GaN region 2 and a second p-type GaN region 3 with different doping concentrations and the same thickness front and back along a gate width, a rear surface of the first p-type GaN region 2 coincides with a front surface of the second p-type GaN region 3, and left and right edges of the first p-type GaN region and the second p-type GaN region are aligned; and a gate electrode 7 is located above the p-type GaN regions with different doping concentrations.

In this embodiment, the AlGaN/GaN heterojunction epitaxial layer 1 has a diameter of 2 inches and a total thickness of 800 μm.

In this embodiment, both the first p-type GaN region 2 and the second p-type GaN region 3 are cuboids with a length of 90 nm, a width of 20 μm and a thickness of 80 nm, and have a distance of 2 μm from the source electrode 5 and a distance of 2 μm from the drain electrode 6, and doping concentrations of the first p-type GaN region 2 and the second p-type GaN region 3 are $1\times10^8/cm^{-3}$ and $1\times10^{18}/cm^{-3}$, respectively.

In this embodiment, the source electrode 5 and the drain electrode 6 are Ti/Al/Ni/Au metal layers, the source electrode 5 and the drain electrode 6 are cuboids with a height of 380 nm, a length of 1000 nm and a width of 40 μm, and a spacing between the source electrode 5 and the drain electrode 6 is 4.09 μm; a left side of the source electrode 5 coincides with a left edge of the active region 4, a right side of the drain electrode 6 coincides with a right edge of the active region 4, and front and rear edges of the source electrode 5 and the drain electrode 6 coincide with front and rear edges of the active region 4.

In this embodiment, the rear edge of the active region 4 coincides with the rear edge of the second p-type GaN region 3, and the front edge of the active region 4 coincides with the front edge of the first p-type GaN region 2. The active region 4 has a height of 2.02 μm, a length of 6.09 μm and a width of 40 μm.

In this embodiment, the gate electrode 7 is a Ni/Au metal layer, which is a cuboid, has a height of 300 nm and a width of 40 μm, and has the same length as that of the second p-type GaN region 3.

Embodiment 2

Figure 1:
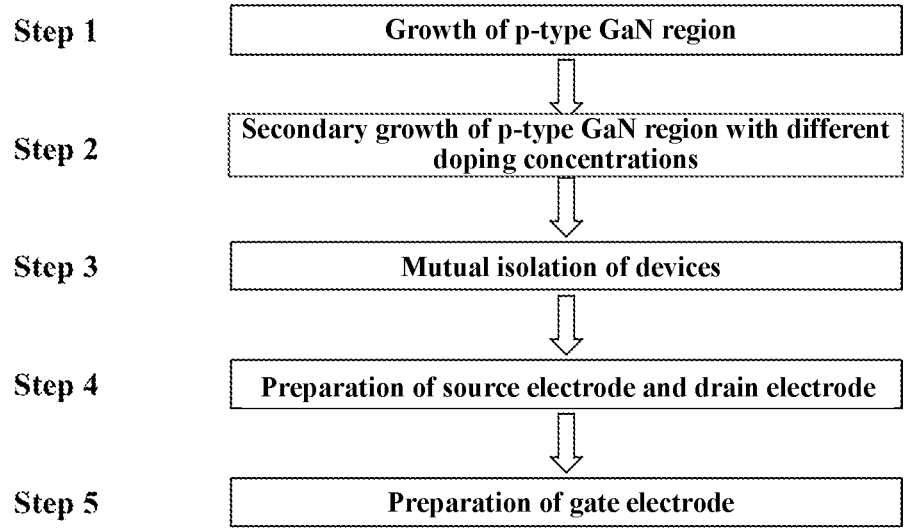
FIG. 1 is a flowchart of a method of preparing a high-linearity GaN-based millimeter wave device in an embodiment of the present invention.
Figure 2:
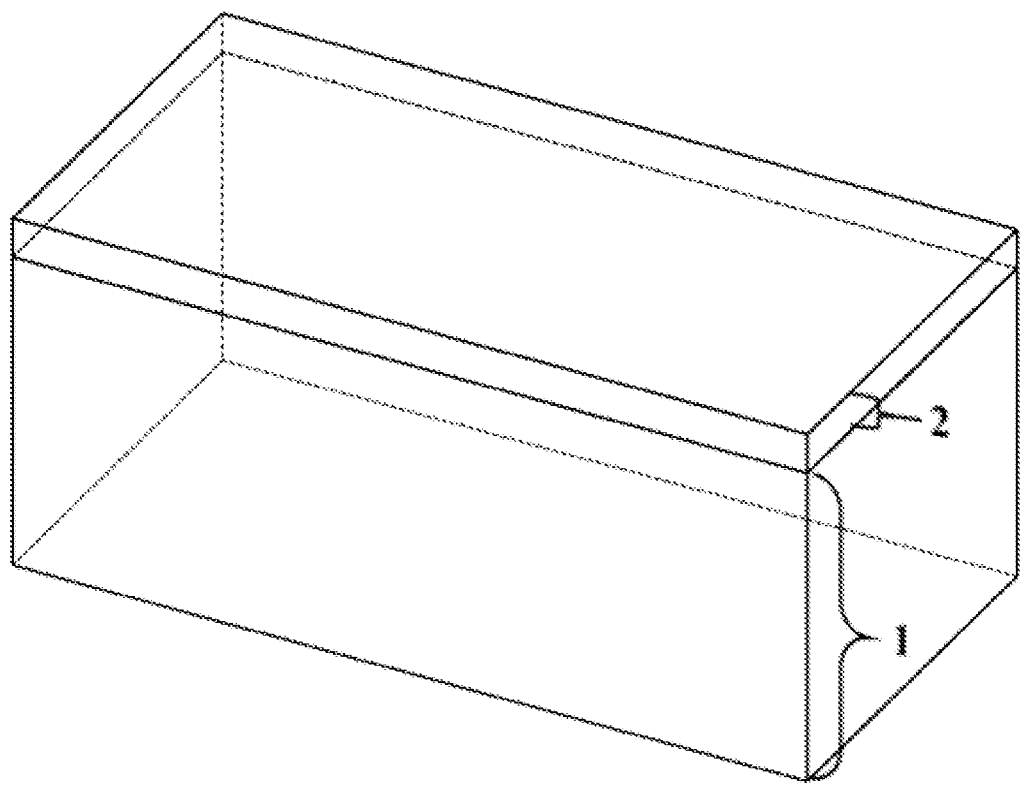
FIGS. 2-5 are three-dimensional perspective views of the high-linearity GaN-based millimeter wave device at steps S1 to S4 in the preparation process, respectively.
Figure 3:
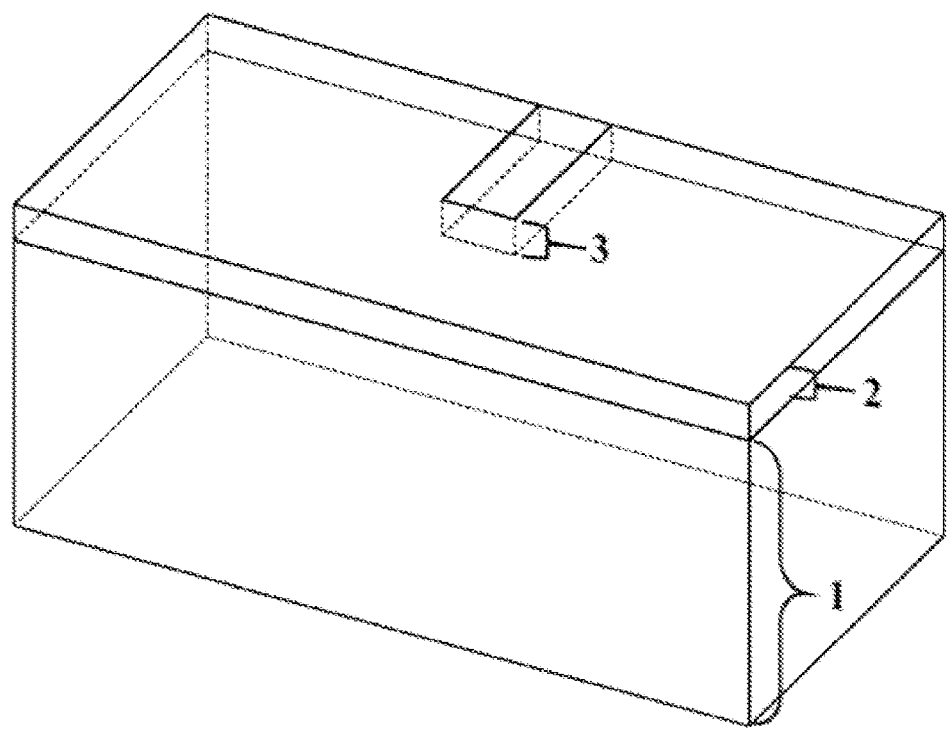
Figure 4:
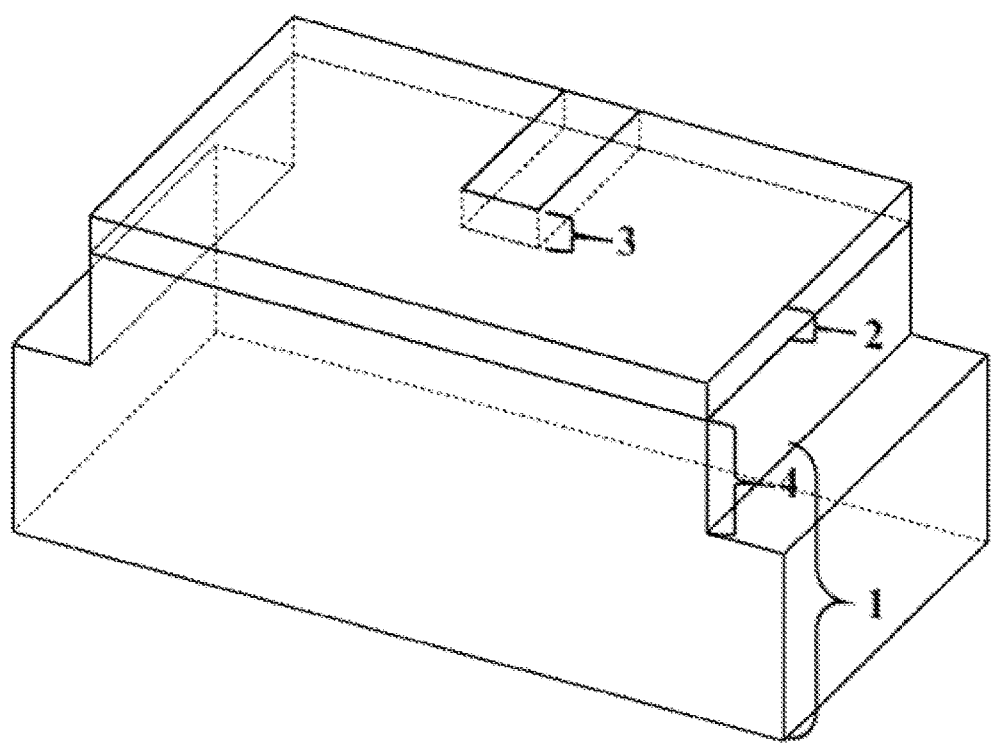
Figure 5:
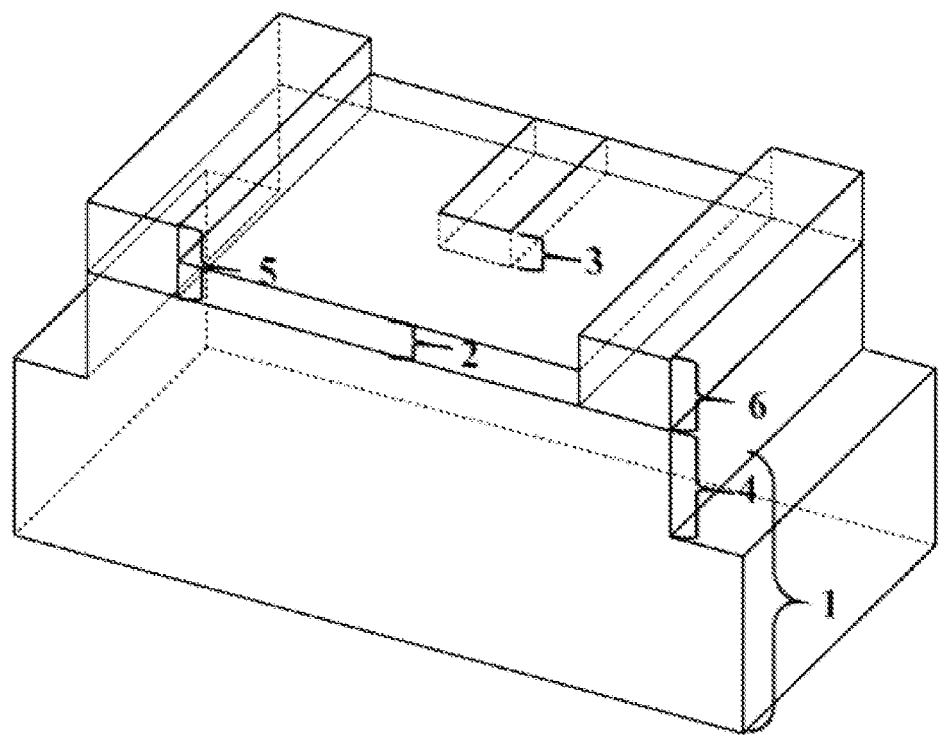
Figure 6:
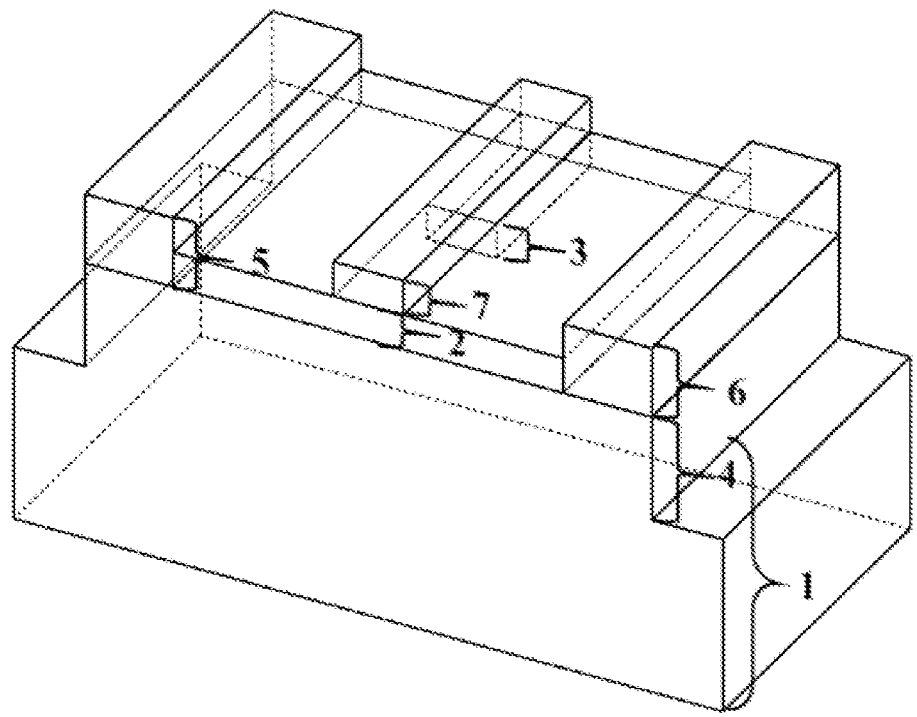
FIG. 6 is a three-dimensional perspective view of the high-linearity GaN-based millimeter wave device when a gate electrode is prepared during the preparation process.

A method of preparing a high-linearity GaN-based millimeter wave device is provided, as shown in FIG. 1, it includes the following steps:

S1, growth of p-type GaN region: in this embodiment, a silicon substrate is selected, an AlGaN/GaN heterojunction epitaxial layer 1 is grown on the substrate by metal-organic compound vapor deposition, and a first p-type GaN region 2 is directly grown on the AlGaN/GaN heterojunction epitaxial layer 1; the first p-type GaN region 2 has a thickness of 80 nm, is doped with an impurity of Mg, and has a doping concentration of $1\times10^8/cm^{-3}$, as shown in FIG. 2;

S2, secondary growth of p-type GaN region with different doping concentrations: in this embodiment, a positive photoresist is used to cover a region except the second p-type GaN region 3 of the secondary growth, wherein the region being not covered by the photoresist has a length between 10 nm and 100 nm, and a width greater than 5 μm, and region is etched to within 3 nm above and below the AlGaN layer using the mixed gas of $BCl_3$ and $Cl_2$ by the inductively coupled plasma etching method; a secondary epitaxial growth is performed by the metal-organic compound vapor deposition, the grown second p-type GaN region 3 has a length of 90 nm, a width of 20 μm, and a thickness of 80 nm, is doped with an impurity of Mg, and has a doping concentration of $1\times10^{18}/cm^{-3}$; and finally, a device surface is smoothed using a chemical mechanical polishing technique, as shown in FIG. 3;

S3, mutual isolation of devices: in this embodiment, a position of the active region 4 is defined by the photoresist on the upper surface of the AlGaN/GaN heterojunction epitaxial layer 1 and the active region 4 is covered, the rear edge of the active region 4 coincides with the rear edge of the second p-type GaN region 3, the front edge of the active region is 20 μm away from the front edge of the second p-type GaN region 3, the left edge of the active region is 3 μm away from the left edge of the second p-type GaN region 3, and the right edge of the active region is 3 μm away from the right edge of the second p-type GaN region 3; the upper surface of the AlGaN/GaN heterojunction epitaxial layer 1 in a non-active region 4 is etched by plasma bombardment, and the etching depth is 200 nm-600 nm, as shown in FIG. 4;

S4, stripping out the source electrode and the drain electrode, and annealing to form ohmic contact: in this embodiment, the photoresist is used to define positions and patterns of the source electrode 5 and the drain electrode 6 so that the positions of the source electrode 5 and the drain electrode 6 are at two ends of an upper surface of the active region 4; a left edge of the source electrode 5 coincides with a left edge of the active region 4 with a length of 1 μm and a thickness of 380 nm, a right edge of the drain electrode 6 coincides with a right edge of the active region 4 with a length of 1 μm and a thickness of 380 nm; regions of non-source electrode 5 and non-drain electrode 6 being covered with the photoresist are first etched to a surface of the AlGaN layer using the mixed gas of $BCl_3$ and $Cl_2$ or the AlGaN within 3 nm is over-etched by the inductively coupled plasma etching method, and then the source electrode 5 and the drain electrode 6 are formed by using electron beam evaporation or magnetron sputtering method and a stripping process, and finally annealing in nitrogen atmosphere at a temperature above 800° C. allows the source electrode 5 and the drain electrode 6 to form ohmic contact with the AlGaN/GaN heterojunction epitaxial layer 1, as shown in FIG. 5; and S5, preparing a gate electrode: in this embodiment, a position and a pattern of the gate electrode 7 is defined using a positive electron beam resist, the gate electrode has a length equal to the length of the second p-type GaN region 3 in step S2 and is disposed directly above the first p-type GaN region 2 and the second p-type GaN region 3; the gate electrode 7 is formed by using the electron beam evaporation or magnetron sputtering method and the stripping process and has a thickness of 300 nm, as shown in FIG. 6;

the gate electrode 7, the source electrode 5 and the drain electrode 6 are protected using the positive photoresist, and places being not covered by the photoresist are etched to the AlGaN layer or over-etched AlGaN layer within 3 nm by using the dry etching process; and the photoresist is removed after the etching is completed to complete a preparation of the high-linearity GaN-based millimeter wave device, as shown in FIG. 7.

The present invention provides a method of preparing a high-linearity GaN-based millimeter wave device, in which a method of modulating the threshold voltage of the device using the p-type GaN regions with different doping concentrations is adopted, which reduces the requirement of etching accuracy of a barrier layer and the influence on saturation current, gives full play to the characteristics of the influence of the thickness and doping concentration of p-type GaN regions on the threshold voltage and transconductance of the device, and makes it possible for the devices with different threshold voltages to achieve high linearity.

Figure 8:
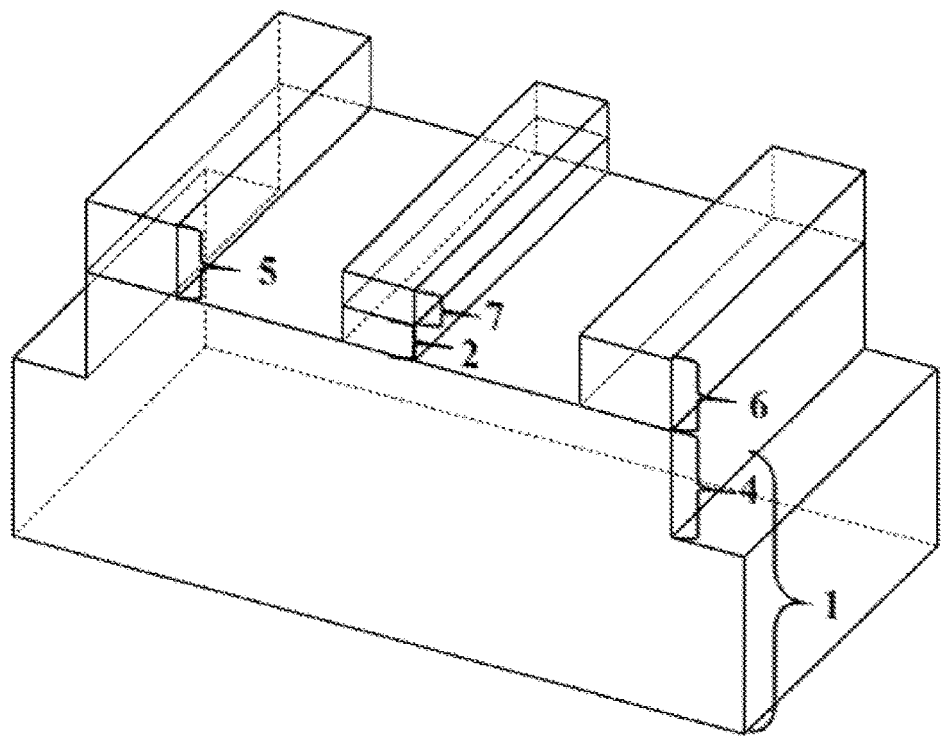
FIG. 8 is a three-dimensional perspective view of a comparison device of the high-linearity GaN-based millimeter wave device in an embodiment of the present invention.
Figure 9:
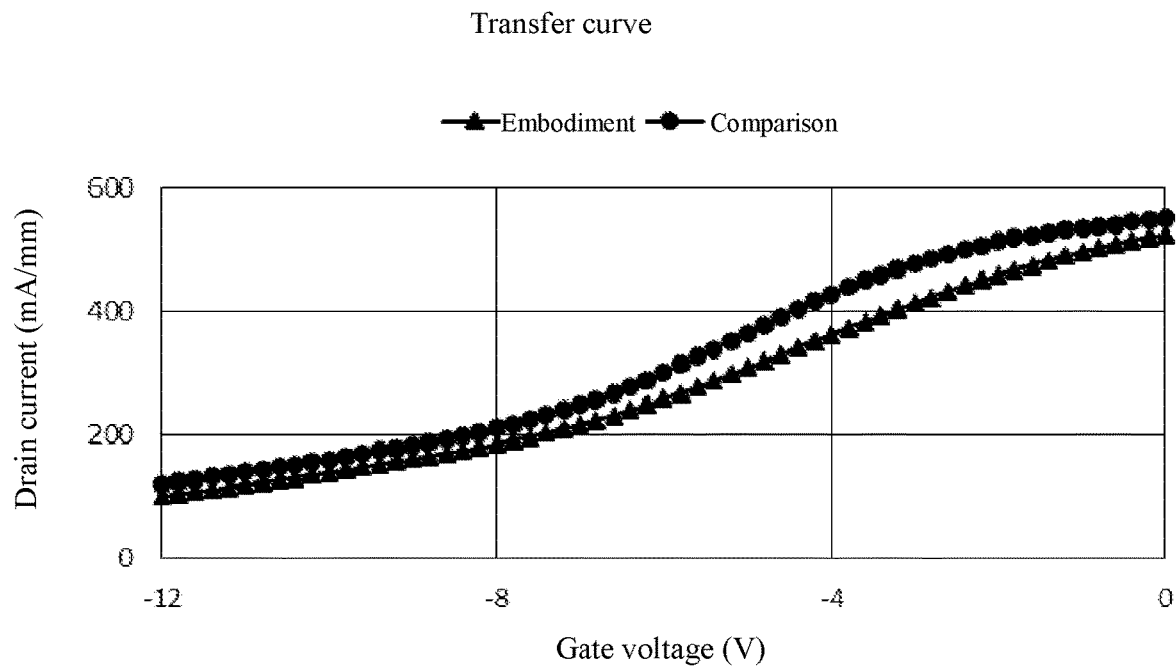
FIG. 9 is a schematic diagram of a transfer curve of the high-linearity GaN-based millimeter wave device in an embodiment of the present invention.
Figure 10:
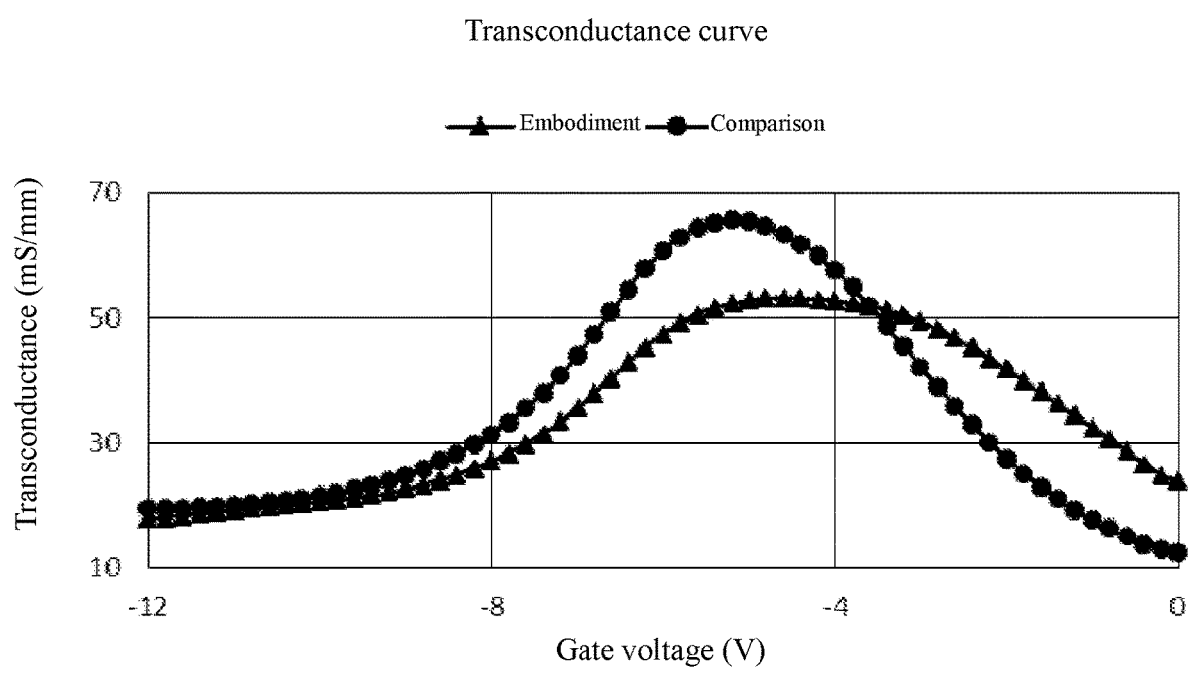
FIG. 10 is a schematic diagram of a transconductance curve of the high-linearity GaN-based millimeter wave device in an embodiment of the present invention.
Figure 11:
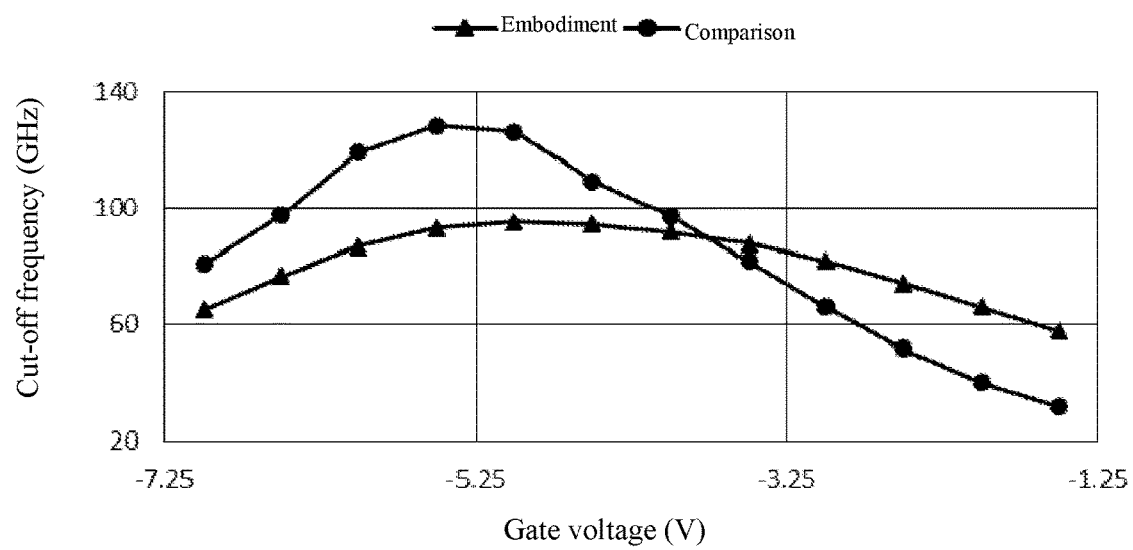
FIG. 11 is a schematic diagram of a cut-off frequency versus a gate voltage of the high-linearity GaN-based millimeter wave device in an embodiment of the present invention.
Figure 12:
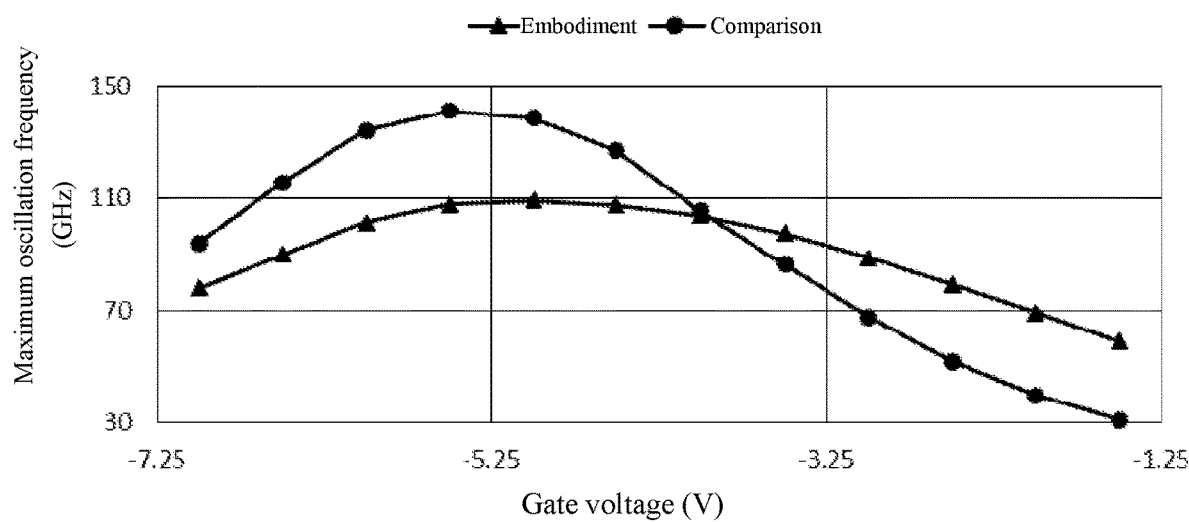
FIG. 12 is a schematic diagram of a maximum oscillation frequency versus the gate voltage of the high-linearity GaN-based millimeter wave device in an embodiment of the present invention.

The p-type GaN region under the gate is changed to a single doping concentration, which is a traditional p-type GaN gate device. The cross-sectional view is shown in FIG. 8, where the doping concentration of p-type GaN region is $1\times10^8/\text{cm}^{-3}$. The DC characteristics and RF characteristics of this embodiment and the traditional p-type GaN gate device are simulated by Silvaco software. The simulation results are shown in FIGS. 9-12. As shown in FIG. 9, the saturation current of the high-linearity GaN-based millimeter wave device is 4.59% smaller than that of the traditional p-type GaN gate devices. As shown in FIG. 10, the GVS of the high-linearity GaN-based millimeter wave device is 4.2 V, and the GVS of the traditional p-type GaN gate device is 2.6 V, where GVS is defined as a gate span with transconductance reduction of 20%. As shown in FIGS. 11 and 12, a cut-off frequency versus the gate voltage and the maximum oscillation frequency versus the gate voltage are relatively flat over a large gate bias range.

The above embodiments are only preferred examples of the present invention, and do not constitute any limitation to the present invention. It is obvious to those skilled in the art that upon learning the contents and principles of the present invention, various modifications and changes in form and detail can be made according to the method of the present invention without departing from the principles and scope of the present invention, but these modifications and changes based on the present invention are still protected by the claims of the present invention.

The invention claimed is:

1. A method of preparing a high-linearity GaN-based millimeter wave device, comprising:
   S1, growing an AlGaN/GaN heterojunction epitaxial layer on a substrate and directly growing a first p-type GaN region on the AlGaN/GaN heterojunction epitaxial layer, wherein a thickness of the first p-type GaN region is between 5 nm and 100 nm;
   S2, covering a region except a second p-type GaN region with a first photoresist, wherein a region not being covered by the first photoresist has a length between 10 nm and 100 nm and a width greater than 5 μm, and the region is etched to a AlGaN layer of the AlGaN/GaN heterojunction epitaxial layer by a dry etching process; performing a secondary epitaxial growth, wherein a thickness of the second p-type GaN region is equal to a length of the first p-type GaN region in step S1, and a doping concentration of the second p-type GaN region is greater than a doping concentration of the first p-type GaN region in step S1; and smoothing a device surface using a chemical mechanical polishing technique;
   S3, defining a position of an active region by a second photoresist on an upper surface of the AlGaN/GaN heterojunction epitaxial layer and covering the active region; and etching an upper surface of the AlGaN/GaN heterojunction epitaxial layer in a non-active region by plasma bombardment with an etching depth of 200 nm-600 nm;
   S4, defining positions and patterns of a source electrode and a drain electrode using a third photoresist so that the positions of the source electrode and the drain electrode are at two ends of an upper surface of the active region; front and rear edges of the source electrode and the drain electrode coinciding with front and rear edges of the active region; regions of non-source electrode and non-drain electrode being covered with the third photoresist, first etching the regions to a surface of the AlGaN layer or over-etching the AlGaN layer within 3 nm using a dry etching method, then forming the source electrode and the drain electrode by using an electron beam evaporation or magnetron sputtering method and a stripping process, and annealing in nitrogen atmosphere at a temperature above 800° C., so that the source electrode and the drain electrode form ohmic contacts with the AlGaN/GaN heterojunction epitaxial layer; and
   S5, defining a position and a pattern of the gate electrode using a fourth photoresist, the gate electrode having a length equal to the length of the second p-type GaN region in step S2 and disposed directly above the first p-type GaN region and the second p-type GaN region; forming the gate electrode by using an electron beam evaporation or magnetron sputtering method and a stripping process; protecting the gate electrode, the source electrode and the drain electrode using a fifth photoresist, and etching places being not covered by the fifth photoresist to the AlGaN layer or the over-etching AlGaN layer within 3 nm by using a dry etching process; removing the fifth photoresist after the etching to complete the preparation of the high-linearity GaN-based millimeter wave device.

2. The method of preparing a high-linearity GaN-based millimeter wave device according to claim 1, wherein in step S1, a substrate material is one of silicon, silicon carbide, sapphire or diamond; in step S1, an impurity doped in the growth of the first p-type GaN region is one of Mg, Zn or Fe; and the first p-type GaN region has a doping concentration of above $1\times10^3/\text{cm}^{-3}$ and a growth thickness between 5 nm and 100 nm.

3. The method of preparing a high-linearity GaN-based millimeter wave device according to claim 1, wherein growth modes of the first p-type GaN region and the second p-type GaN region are both metal-organic chemical vapor deposition or molecular beam epitaxy; the dry etching is any one of inductively coupled plasma etching, reactive ion etching or other ion etching processes.

4. The method of preparing a high-linearity GaN-based millimeter wave device according to claim 1, wherein in step S2, a gas for etching GaN in the dry etching is one or a mixture of Cl-containing gases such as $Cl_2$, $BCl_3$ and $SiCl_4$.

* * * * *